United States Patent
Sunkavalli (10) Patent No.: US 9,208,870 B2
(45) Date of Patent: Dec. 8, 2015

(54) MULTI-PORT MEMORY DEVICES AND METHODS HAVING PROGRAMMABLE IMPEDANCE ELEMENTS

(75) Inventor: Ravi Sunkavalli, Cupertino, CA (US)

(73) Assignee: Adesto Technologies Corporation, Sunnyvale, CA (US)

(*) Notice: Subject to any disclaimer, the term of this patent is extended or adjusted under 35 U.S.C. 154(b) by 284 days.

(21) Appl. No.: 13/615,493

(22) Filed: Sep. 13, 2012

(65) Prior Publication Data

US 2014/0071733 A1    Mar. 13, 2014

(51) Int. Cl.
*G11C 13/00* (2006.01)
*G11C 8/16* (2006.01)
*G11C 7/10* (2006.01)

(52) U.S. Cl.
CPC ........... *G11C 13/003* (2013.01); *G11C 8/16* (2013.01); *G11C 13/0002* (2013.01); *G11C 13/004* (2013.01); *G11C 13/0011* (2013.01); *G11C 13/0061* (2013.01); *G11C 13/0069* (2013.01); *G11C 7/1075* (2013.01); *G11C 2213/74* (2013.01); *G11C 2213/79* (2013.01)

(58) Field of Classification Search
CPC ........... G11C 2207/2209; G11C 8/16; G11C 13/0021; G11C 13/0009; G11C 11/00; G11C 13/003; G11C 13/0002; G11C 13/004; G11C 13/0011; G11C 13/0061; G11C 13/0069; G11C 7/1075; G11C 2213/79; G11C 2213/74
USPC ......... 365/148, 153, 158, 163, 230.05, 51, 63
See application file for complete search history.

(56) References Cited

U.S. PATENT DOCUMENTS

| | | | |
|---|---|---|---|
| 5,761,115 A | 6/1998 | Kozicki et al. | |
| 6,418,049 B1 | 7/2002 | Kozicki et al. | |
| 6,487,106 B1 | 11/2002 | Kozicki | |
| 6,635,914 B2 | 10/2003 | Kozicki et al. | |
| 6,825,489 B2 | 11/2004 | Kozicki | |
| 6,865,117 B2 | 3/2005 | Kozicki | |
| 6,927,411 B2 | 8/2005 | Kozicki | |
| 6,985,378 B2 | 1/2006 | Kozicki | |
| 7,101,728 B2 | 9/2006 | Kozicki et al. | |
| 7,215,568 B2 | 5/2007 | Liaw et al. | |
| 7,227,169 B2 | 6/2007 | Kozicki | |
| 7,294,875 B2 | 11/2007 | Kozicki | |
| 7,372,065 B2 | 5/2008 | Kozicki et al. | |
| 7,385,219 B2 | 6/2008 | Kozicki et al. | |
| 7,402,847 B2 | 7/2008 | Kozicki et al. | |
| 7,420,841 B2 | 9/2008 | Ruf et al. | |
| 7,495,971 B2 | 2/2009 | Egerer | |
| 7,561,460 B2 | 7/2009 | Liaw et al. | |
| 7,728,322 B2 | 6/2010 | Kozicki | |
| 7,746,683 B2 | 6/2010 | Hoffmann et al. | |
| 8,294,488 B1 | 10/2012 | Derhacobian et al. | |
| 8,331,128 B1 | 12/2012 | Derhacobian et al. | |
| 2003/0223283 A1* | 12/2003 | Kunikiyo | 365/200 |
| 2008/0080226 A1 | 4/2008 | Mikolajick et al. | |
| 2008/0084736 A1* | 4/2008 | Lee et al. | 365/163 |
| 2010/0005244 A1* | 1/2010 | Weiberle et al. | 711/130 |
| 2011/0228594 A1* | 9/2011 | Rao et al. | 365/158 |

* cited by examiner

Primary Examiner — J. H. Hur (57) ABSTRACT

A memory device can include at least two ports for transferring data to and from the memory device; and plurality of memory cells, each memory cell including at least one element programmable between different impedance states, and a plurality of access devices, each access device providing a current path between the element and a different one of the ports.

18 Claims, 9 Drawing Sheets

| PORT 0 | PORT 1 | PORT 2 | RESULT |
|---|---|---|---|
| RD | RD | RD | ALL ACCESSES ALLOWED |
| RD | RD | WR | WR VALID - RD UNKNOWN |
| RD | WR | RD | WR VALID - RD UNKNOWN |
| RD | WR | WR | INVALID |
| WR | RD | RD | WR VALID - RD UNKNOWN |
| WR | RD | WR | INVALID |
| WR | WR | RD | INVALID |
| WR | WR | WR | INVALID |

MULTI-PORT MEMORY DEVICES AND METHODS HAVING PROGRAMMABLE IMPEDANCE ELEMENTS

TECHNICAL FIELD

The present disclosure relates generally to memory devices, and more particularly to memory devices having elements programmable between two or more impedance states.

DETAILED DESCRIPTION

Embodiments disclosed herein show memory devices and methods that can include elements programmable between two or more different impedance states. The memory devices can include memory cells that can enable simultaneous access to a same memory element via different data ports.

In the embodiments below, like sections are referred to by the same reference character but with the leading digit(s) corresponding to the figure number.

Referring to FIGS. 1A to 1E, a memory cell 100 and corresponding operations, according various embodiments are shown in schematic diagrams. A memory cell 100 can include a memory element 102 and two or more access devices 104-0 to -n. An element 102 can take various forms, but in particular embodiments can be a two terminal element that includes one or more memory materials formed between two electrodes. By application of an electric field, the element 102 can be programmed between two or more impedance states. An impedance state can be static or dynamic. In a static case, in response to the application of sense (e.g., read) conditions, an impedance of an element can remain substantially the same. However, in the dynamic case, at least one of the impedance states changes in response to the sense conditions.

In some embodiments, a memory element can be a conductive bridging random access memory (CBRAM) type element, in which conductive regions (e.g., filaments) can be formed and dissolved within a solid electrolyte, or other material, by application of different electric fields. In very particular embodiments, a memory material of an element can include a chalcogenide and/or a metal oxide.

Referring still to FIGS. 1A to 1E, an element 102 can have a first terminal 106-0 connected to receive one or more bias voltages, and a second terminal 106-1 connected to a common node 108.

Access devices 104-0 to -n can be formed between the common node 108 and a corresponding access port 110-0 to -n. Each access device (104-0 to -n) can enable or disable a current path to the common node 108 in response to a control signal S0 to Sn. Each access port (110-0 to -n) can be a separate data path for outputting read data and/or receiving write data. Access devices (104-0 to -n) can be enabled simultaneously, allowing multi-port access to memory element 102. As will be described in more detail below, in some embodiments, multi-port access can be restricted to certain kinds of accesses (e.g., reads only, but not writes). While FIG. 1 shows a memory cell 100 connected to n+1 ports, other embodiments can include as few as two ports.

It is understood that there can be various intervening circuits formed between the access devices (104-0 to -n) and their corresponding ports (110-0 to -n). Such intervening circuits can include, but are not limited to, decoder, read (sense) amplifiers, write amplifiers, or data latches.

A memory cell 100 can be repeated numerous times to form an array or other structure in a memory device. In particular embodiments, a memory cell 100 can be formed in an array with select signals (S0 to Sn) being provided by word lines common to a row of memory cells. Similarly, each access devices (104-0 to -n) can be formed between the common node 108 and a corresponding bit line, where the bit line is common to a column of memory cells.

Figure 1A:
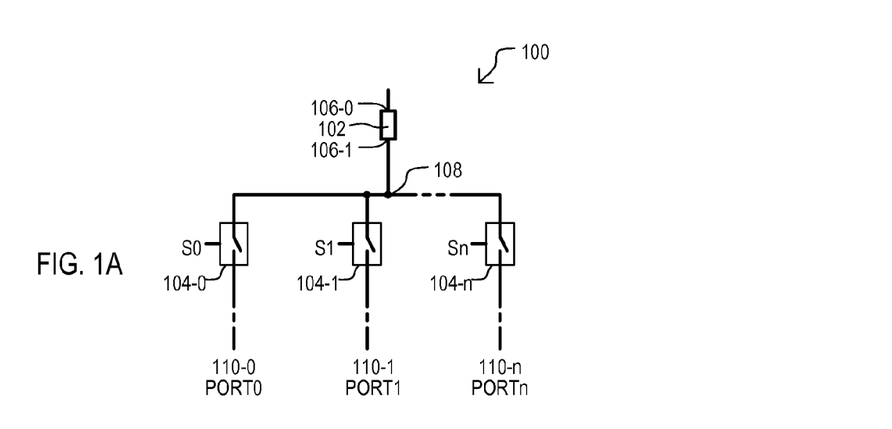
FIGS. 1A to 1E are schematic diagrams of a memory cell and operations according to embodiments.

FIG. 1A shows a memory cell 100 in a non-accessed state. Access devices (104-0 to -n) can be disabled, isolating ports (110-0 to -n) from element 102.

Figure 1B:
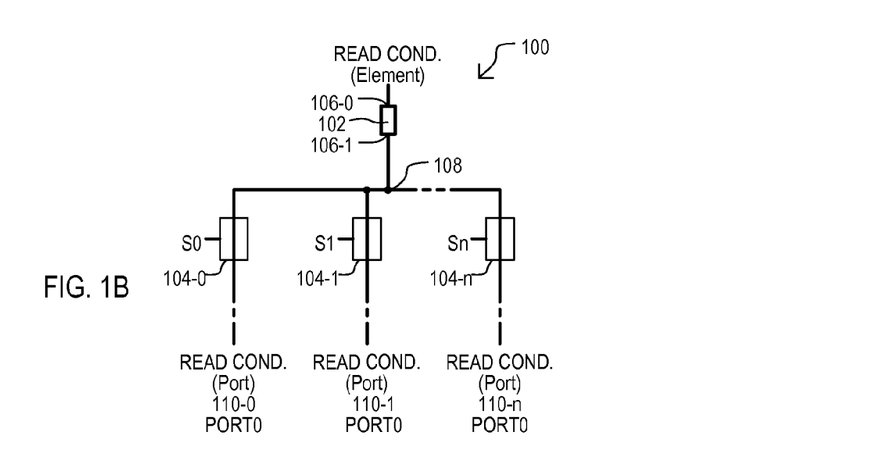

FIG. 1B shows a multi-port read operation according to one particular embodiment. In the operation shown, it is assumed that a state of element 102 is to be detected via ports 110-0, -1, -n. Thus, access devices (104-0, -1, -n) corresponding to the ports can be enabled, providing a low impedance path between the ports (110-0, -1, -n) and the element 102.

Read conditions can be asserted between the element 102 and accessing ports (110-0, -1, -n), to sense an element state. Such conditions are shown as READ COND. (Element) and READ COND. (Port). In very particular embodiments, read conditions can generate a current (or lack thereof) that reflects a data state of the element and/or generate a voltage reflecting a data state of the element. A read current or voltage can be static (i.e., is constant in response to applied read conditions) or dynamic (i.e., changes in response to applied read conditions).

Figure 1C:
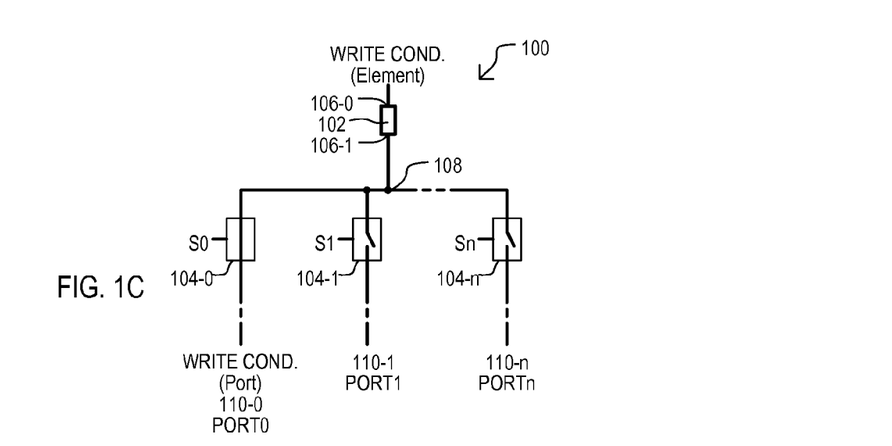

FIG. 1C shows a write operation according to one particular embodiment. In the operation shown, it is assumed that write operations are allowed to one port at a time, and port 104-0 is the writing port. As a result, access devices 104-0 can be enabled, while access devices 104-1 to -n can be disabled.

Write conditions can be asserted between the element 102 and the accessing port 110-0 to change a state of element 102 to a desired impedance state (if it is not already in such a state). Write conditions are shown as WRITE COND. (Element) and WRITE COND. (Port). In very particular embodiments, write conditions can create an electric field across terminals 106-0/1 of element 102. It is understood that for the writing of some data values, such an electric field can have one polarity, while writes of other data values can reverse the electric field. For example, in very particular embodiments, writes can include "erase" operations having one polarity that place elements into a relatively high impedance state, and "program" operations that place an element into relatively low impedance state.

Figure 1D:
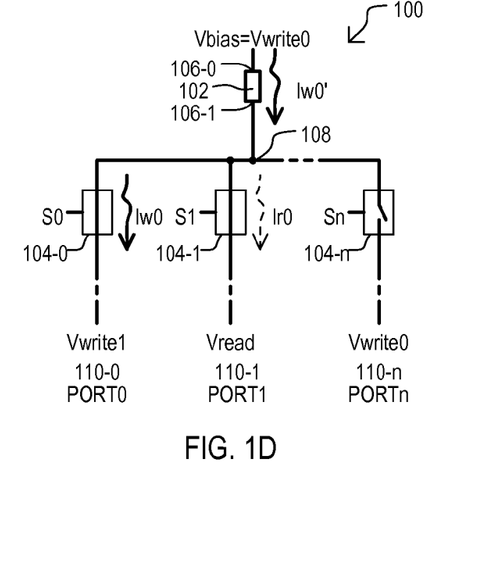
Figure 1E:
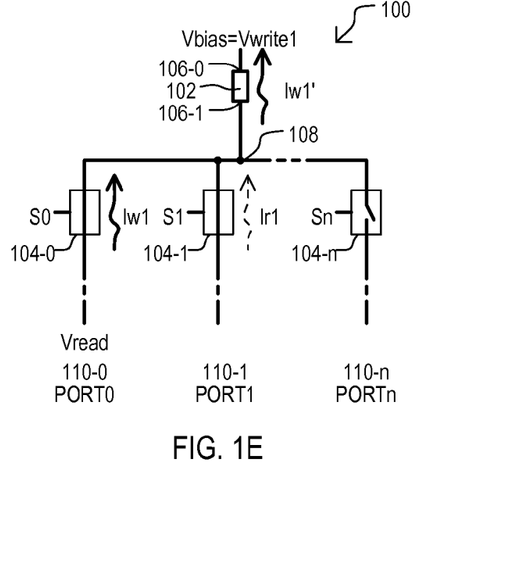

In some embodiments, types of operations can be interlocked. For example, if a write operation is taking place, no read operations can take place. However, in some embodiments, write operations can "overpower" a read operation to the same element via a different port. FIGS. 1D and 1E show such an embodiment.

FIG. 1D shows a write operation via PORT0 110-0 while a read operation occurs via PORT1 110-1. In the very particular embodiment shown, a write voltage Vwrite0 can be applied to terminal 106-0 of element 102. At the same time a second write voltage Vwrite1 can be applied at port 110-0, and a read voltage Vread can be applied at port 110-1. Vwrite0 can be greater than Vwrite1. Thus, a write current Iw0' can flow through element 102. In addition, Vread can be greater than Vwrite0 by a sufficient amount to generate a read current Ir0 through PORT1 110-1. Accordingly, write conditions can force a correct read operation on a different port.

FIG. 1E shows a simultaneous write and read operation, like that of FIG. 1D, but with an opposite programming voltage. A write voltage Vwrite1 can applied to terminal 106-0 can be lower than a voltage Vwrite0 applied at PORT0 110-0, thus a programming current opposite to that of FIG. 1D can flow through element 102. The reading port (PORT1 110-1) can receive a read voltage Vread. Vread can be a voltage that is sufficient amount to generate a read current Ir1 through PORT1 110-1.

Figure 2:
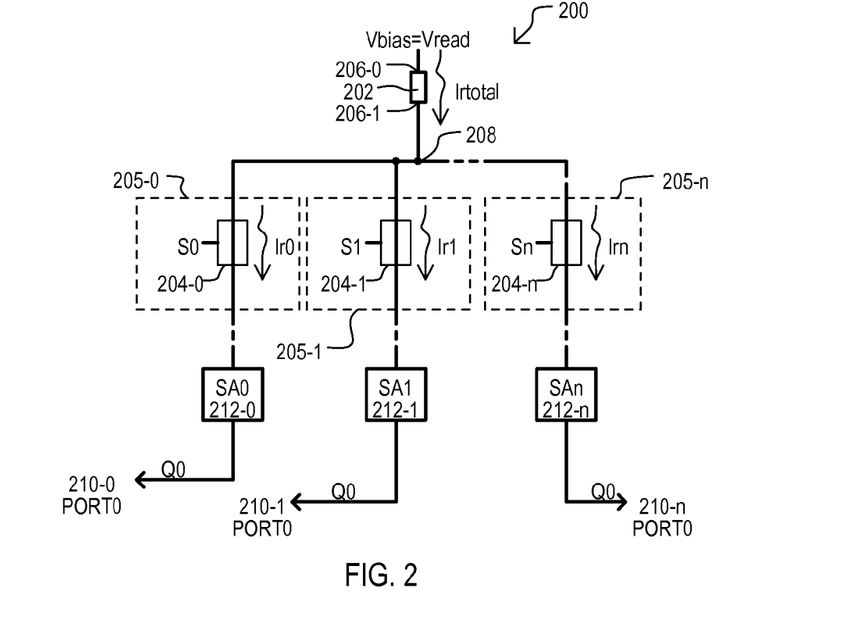
FIG. 2 is a schematic showing a multi-port read operation for a memory cell, according to an embodiment.

FIG. 2 shows a multi-port read operation according to another embodiment. FIG. 2 shows a memory cell 200 as in FIG. 1A, but also shows sense amplifiers (SAs) 212-0 to -n and decoding circuits 205-0 to -n corresponding to each port 210-0 to -n. Each SA (212-0 to -n) can sense a data state of element 202 based on a current flowing from the corresponding access device (204-0 to -n). In the operation shown, it is assumed that simultaneous read requests to the memory cell 200 are received on ports 210-0, -1 and -n.

Access devices 204-0 to -n can form part of corresponding decoding circuits 205-0 to -n. Decoding circuits (205-0 to -n) can enable paths to element 202 based on received address information.

In a read operation a bias voltage Vread can be applied to terminal 206-0. Access devices (204-0, -1, -n) can be enabled, providing a current path from common node 208 to SAs (212-0 to -n). SAs (212-0 to -n) can be at a different potential than Vread, to induce a current flow through element 202 and the corresponding access device (204-0, -1, -n). In the particular operation shown, a current Irtotal can flow through element 202, while currents Ir0, Ir1, Irn can flow to SAs (212-0 to -n).

According to a received current, each SA (212-0 to -n) can generate a read output value (Q0), and provide such a value on the corresponding port (210-0, -1, -n).

It is understood that in an alternate embodiment, read current flow can be the reverse of that shown in FIG. 2.

Figure 3A:
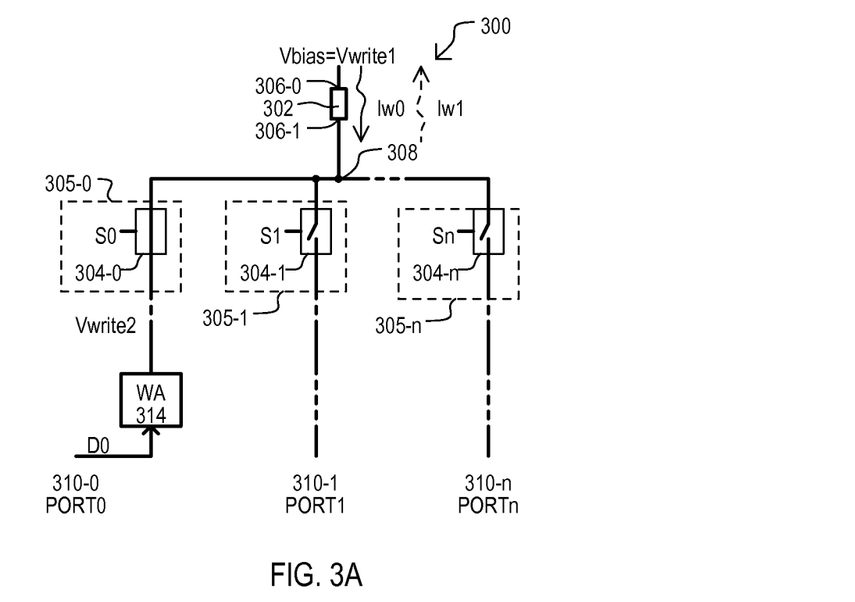
FIGS. 3A and 3B shows write operations for a memory cell, according to embodiments.
Figure 3B:
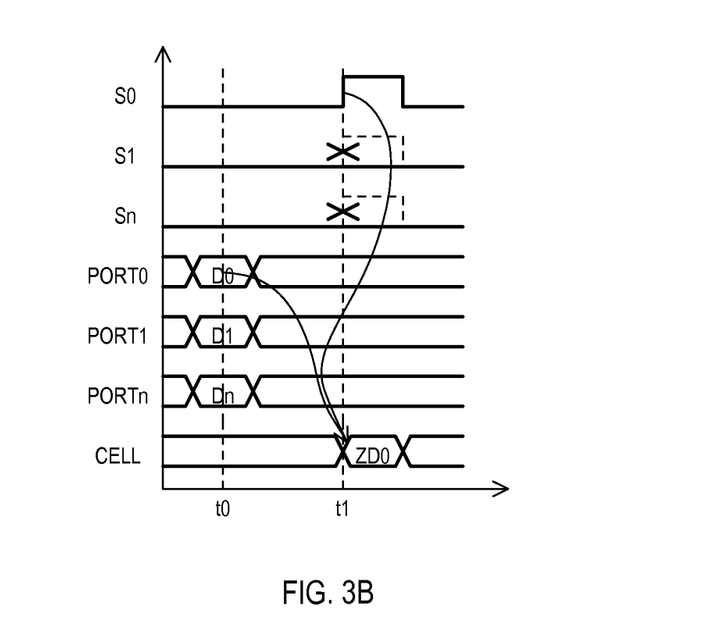

FIGS. 3A and 3B shows write operations according to other embodiments. FIG. 3A shows a memory cell 300 as in FIG. 1A, but also shows a write amplifier (WA) 314 and decoding circuit 305-0 to -n. WA 314 can be connected to a current path corresponding to a port receiving write data. WA 314 can drive its output according to received write data (D0).

As in the case of FIG. 2, access devices (304-0 to -n) can form part of corresponding decoding circuits 305-0 to -n. Decoding circuits (305-0 to -n) can enable paths to element 302 based on received address information. In the operation shown, it is assumed that a write request is received on port 310-0. Other requests can be received on other ports at the same time, however, the write request on port 310-0 is assumed to have priority (i.e., to "win"). Such priority can be established by the design of a memory device that includes memory cell 300, or by the manner in which such a memory device is operated.

In a write operation, a bias voltage Vwrite1 can be applied to terminal 306-0. Only access device 304-0, corresponding to the winning port (PORT0), can be enabled, providing a current path between WA 314 and common node 308. WA 314 can drive its output to a voltage Vwrite2, which can be different than Vwrite1. This can induce a current flow through element 302. A current flow can vary according to a device architecture, and thus is shown in two possible directions (Iw0, Iw1). Because access devices of non-winning ports (i.e., 310-1, -n) are disabled, such ports play no role in the writing of data to the memory element 302.

It is noted that in some embodiments, at least one state of a memory element 302 can be established independently of an operation of WA 314. For example, an element 302 can be placed in a first state by a group program operation that programs all elements of the group to a same impedance state. WA 314 can subsequently selectively write data to element 302 based on whether an input data value (D0) differs from that established by the first state. In one very particular embodiment, elements can be CBRAM type elements that are erased in groups to a high impedance state (e.g., logic 0). A write amplifier 314 can then program an element to a low impedance, in the event an input data value (D0) indicates a low impedance state (e.g., logic 1). If the input data value (D0) indicates the high impedance state, WA 314 can output a voltage that does not create a voltage differential across element 302 or WA 314 can be disabled.

FIG. 3B is a timing diagram showing a write operation for a cell like that of FIG. 3A, according to one very particular embodiment. FIG. 3B shows an operation in which, in the event of simultaneous write requests, one write request prevails.

At time t0, simultaneous write requests can present data values D0, D1 and Dn at data ports PORT0, PORT1 and PORTn, respectively. It is assumed that, according to a predetermined priority, PORT0 takes precedence over the other ports.

At time t1, due to the priority of PORT0, select signal S0 can be activated (driven high in this embodiment), enabling access device 304-0. At the same time, because ports PORT1 and PORTn do not have priority, select signals S1 and Sn can remain de-activated, and access devices 304-1/n can electrically isolate their respective ports 310-1/n from element 302.

After time 1, with access device 304-0 enabled, WA 314 can drive its output and an element 302 can be programmed to an impedance (shown as ZD0) corresponding to the write data value (D0).

Embodiments of the invention can provide for synchronous and/or asynchronous multi-port access to a memory element. Access operations according to such particular embodiments are shown in FIGS. 4A and 4B.

Figure 4A:
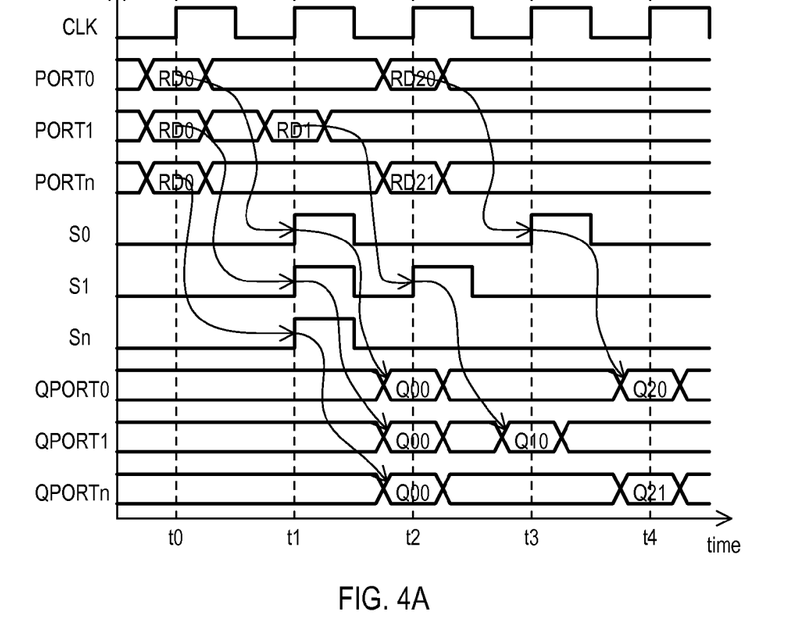
FIGS. 4A and 4B are timing diagrams showing synchronous and asynchronous read operations, according to embodiments.
Figure 4B:
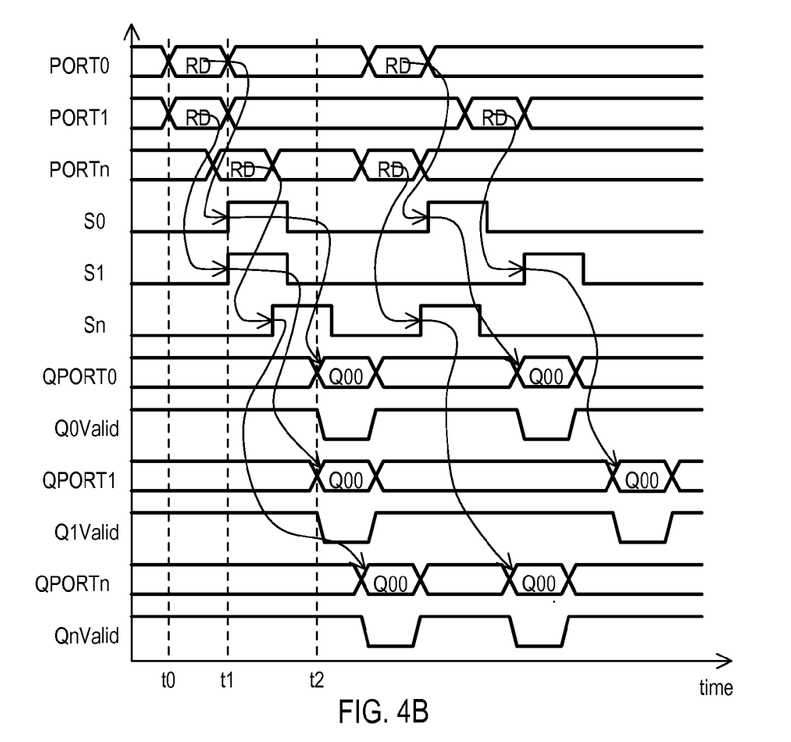

FIG. 4A is a timing diagram showing synchronous read operations according to one embodiment. Operations can be in synchronism with periodic timing signal CLK. It is understood that while the embodiment of FIG. 4A shows operations occurring on rising edges of clock signal CLK, alternate embodiments can have operations on falling edges of clock signal, or at predetermined phase shifts with respect to either such edge.

FIG. 4A shows a number of waveforms, where "x" indicates a particular port. Waveforms PORTx show requests that can be received at each port, via a signal or set of signals. Waveforms Sx are select signals as described herein. Waveforms QPORTx show data values output on different ports in response to the requests.

At time t0, read requests (RD) can be received at all of the ports. It is assumed that such read requests are to the same memory element(s). In response, accessed memory cell(s) can be biased to read conditions.

At time t1, in response to the read requests, selection signals S0, S1, S2 can be activated, creating a current path between the accessed memory cell(s) and sensing circuits. Also at time t1, another read request can be received, but only on one (PORT1).

At time t2, in response to the read requests at time t0, the data value (Q00) from the accessed memory cell(s) can be output as read data on all ports (i.e., QPORT0/1/$n$=Q00). Selection signal S1 can be activated in response to the request at time t1. Also at time t2, two more read requests can be received on PORT0 and PORTn. However, it is assumed that such read requests are to different memory element(s).

At time t3, in response to the read requests at time t1, the data value (Q10) can be output on PORT1 (QPORT1=Q10). Selection signals S0 can be activated in response to the request (RD20) at time t2. It is understood that another activation signal can be activated in response to the request RD21 (this activation signal is not shown, as it is not to the same memory element(s) S0).

At time t4, in response to the read requests at time t1, the data value (Q20) from one accessed memory cell(s) can be output as read data on PORT0 (QPORT0=Q20), and the data value (Q21) from another accessed memory cell(s) can be output as read data on PORTn (QPORTn=Q21).

FIG. 4B is a timing diagram showing asynchronous read operations according to an embodiment. FIG. 4B shows a number of waveforms, like those of FIG. 4A, but does not include a CLK waveform. In addition, FIG. 4B shows waveforms QxValid that indicate when read data are valid on a given port. In FIG. 4B, it is assumed that all shown read requests are to a same memory cell or group of memory cells (that store the data value Q00).

One particular read request will now be described. However, it is understood that the other read requests follow the same operations. Further, the various read operations can occur simultaneously, or can overlap one another in time.

At time0, a read requests (RD) can be received at PORT0 (along with other read requests).

At time t1, in response to the PORT0 read request at time t0, selection signal S0 can be activated. Signal S0 can be activated in response to a read request signal or accompanying signals (e.g., address transitions).

At time t2, in response to the activation of signal S0 at time t1, data value (Q00) from the accessed memory cell(s) can be output as read data on the corresponding port (i.e., QPORT0=Q00).

Figure 5A:
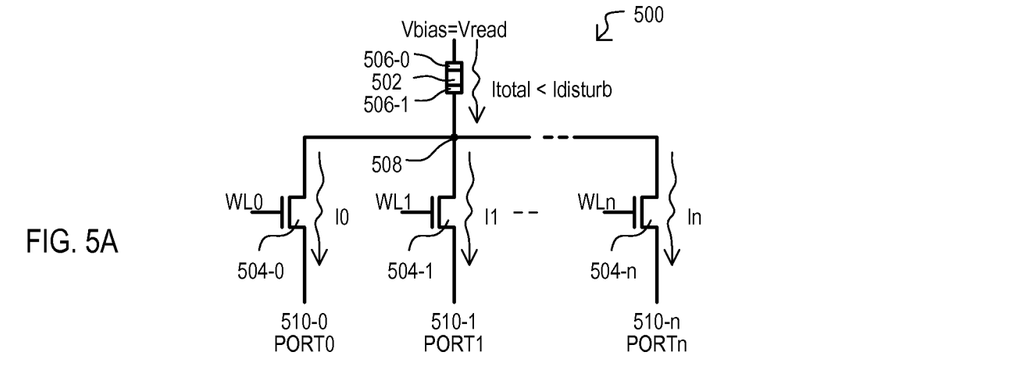
FIGS. 5A to 5C are schematic diagrams showing a memory cell and operations, according to further embodiments.
Figure 5B:
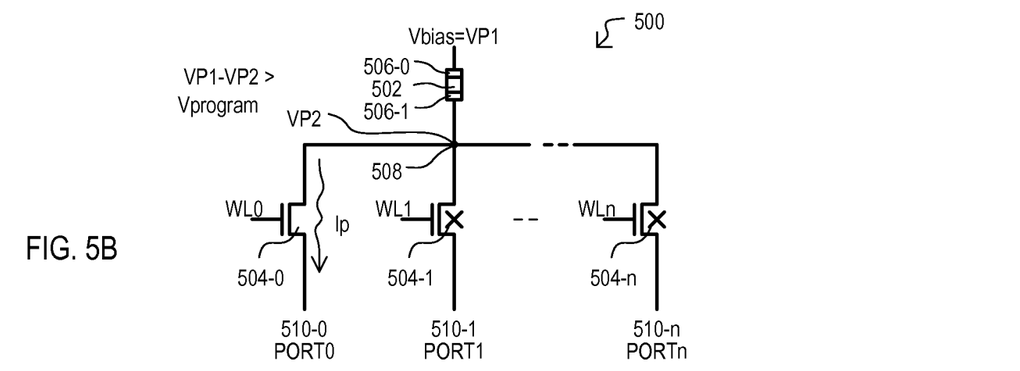
Figure 5C:
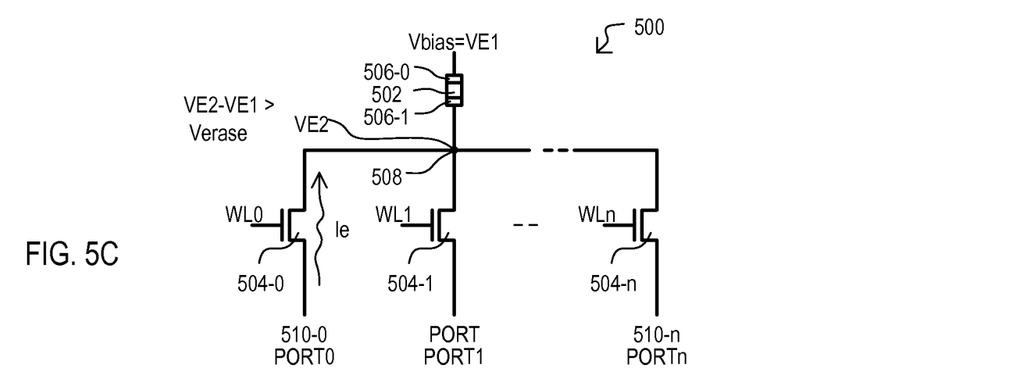

FIGS. 5A to 5C show a memory cell 500 and corresponding operations according to a further embodiment. A memory cell 500 can include sections like those of FIG. 1. However, in the particular embodiment of FIGS. 5A to 5C, a memory element 502 can be a CBRAM type element, programmable between a high and low resistance by application of an electric field. In addition, access devices 504-0 to -n can be insulated gate (e.g., MOS) field effect transistors.

FIG. 5A shows a read operation according to an embodiment. In the read operation, it is assumed that reads to the element 502 are requested from ports PORT0, PORT1 and PORTn at the same time. In response to such read requests, a bias voltage Vread can be applied to a first terminal 506-0 of element 502, and word lines WL0, WL1 and WLn can be driven high, providing a current path to common node 508. Currents I0, I1 and I2 can flow through access transistors 504-0, 504-1 and 504-$n$, respectively. Such currents can be detected to determine a data state of element 502 (by a sense amplifier, or the like). In one embodiment, such currents can be substantially the same.

Referring still to FIG. 5A, in some embodiments a CBRAM element 502 can be subject to write "disturb", in the event a read current through the element 502 is too high. A write disturb can be an unintentional programming of the element. In one very particular embodiment, if an element 502 was programmed to a high resistance state (e.g., erased), a write disturb can undesirably lower the resistance, potentially corrupting the data stored by the element.

Accordingly, in some embodiments a current that flows through an element 502 is restricted during a multi-port read operation, in order to prevent or reduce write disturb. In the particular embodiment shown, this is represented by Itotal<Idisturb, where Itotal is a maximum read current that flows through a cell (i.e., all possible access devices are enabled), and Idisturb is a maximum allowable current to prevent disturb.

Current flowing through an element 502 in a read operation can be restricted in various ways. As but a few examples, a current limiting circuit can be connected a first terminal 506-0, access devices (504-0 to -n) can limit current by biasing, or saturation limits, and/or current limiting circuits can be situated between each access device and the corresponding port (510-0 to -n).

FIG. 5B shows a program operation according to an embodiment. In the program operation shown, it is assumed that a programming occurs via PORT0, and accesses from all other ports are prevented.

In response to the program request, a first terminal 506-0 of memory element 502 can be driven to a first program voltage VP1. Word line WL0 be driven high, providing a current path to common node 508. In the embodiment shown, a program current Ip can flow through access transistors 504-0. Applied biasing conditions can result in a second programming voltage VP2 being applied at common node 508. A difference between the programming voltages can be greater than a programming threshold voltage (VP1-VP2>Vprogram). Consequently, if an element 502 is not already in a low resistance state, it is programmed to a low resistance state.

FIG. 5C shows an erase operation according to one embodiment. In the erase operation shown, it is assumed that an erase occurs via PORT0, and accesses from all other ports are prevented.

In response to the erase request, a first terminal 506-0 of memory element 502 can be driven to a first erase voltage VE1. Word line WL0 be driven high, providing a current path to common node 508. In the embodiment shown, an erase current Ie can flow through access transistors 504-0. Applied biasing conditions can result in a second erase voltage VE2 being applied at common node 508. It is understood that erase voltages VE1 and VE2 result in an opposite biasing direction to that shown in FIG. 5B. A difference between the erase voltages can be greater than an erase threshold voltage (VE2-VE1>Verase). Consequently, if an element 502 is not already in a high resistance state, it is programmed to a high resistance state.

It is understood that in some embodiments, an operation like that of FIG. 5C or that of FIG. 5B may occur without enabling any access transistors (504-0 to -n), by separately biasing common node 508, for a group erase or a group programming of multiple elements.

It is also understood that while FIGS. 5A to 5C show n-channel MOS transistors, alternate embodiment can include p-channel MOS transistors, or other kinds of transistors as access devices.

It is noted that an embodiment like that of FIGS. 5A to 5C can provide for a highly compact memory cell, as compared to other memory cells, having one transistor per port. Thus, a dual port memory cell according to an embodiment can have as few as two transistors, with the storage element being nonvolatile, and formed over a substrate. This is in very sharp contrast to convention dual-port memory cells, such as dual-port static RAM cells, which can be formed from eight transistors, and only store data in a volatile fashion.

While embodiments have shown memory cells with one programmable element, other embodiments can include more than one element per memory cell. In particular embodiments, a memory cell can include two elements programmed to different states. One such embodiment is shown in FIG. 6.

Figure 6:
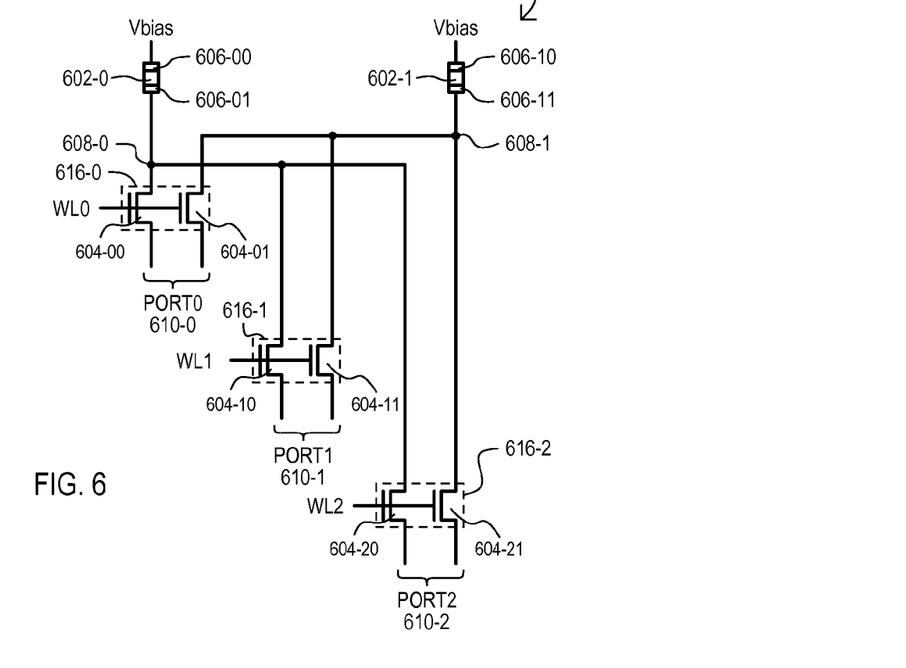
FIG. 6 is a schematic diagram of a differential multi-port memory cell, according to an embodiment.

FIG. 6 shows a memory cell 600 that can include sections like those of FIGS. 3A to 3C. However, unlike FIGS. 3A to 3C, memory cell 600 includes two memory elements 602-0/1. Further, access transistors 604-00 to 604-21, can be arranged into pairs 616-0 to -2, each pair (616-0 to -2) corresponding to a different port (610-0 to -2).

In one embodiment, elements 602-0/1 can be programmed to opposing impedance state. As but one example, if element 602-0 is programmed to a high impedance, element 602-1 can be programmed to a low impedance. Thus, signals output from each transistor pair (616-0 to -2) can be differential signals.

Transistor pairs (616-0 to -2) can be activated together. Further, like the embodiment of FIGS. 3A to 3C, transistor pairs can be (616-0 to -2) can be activated simultaneously for multi-port access to the element pair 602-0/1. In some embodiments, such multi-port access can be limited to read operations, with write operations being restricted to one port.

Figure 7:
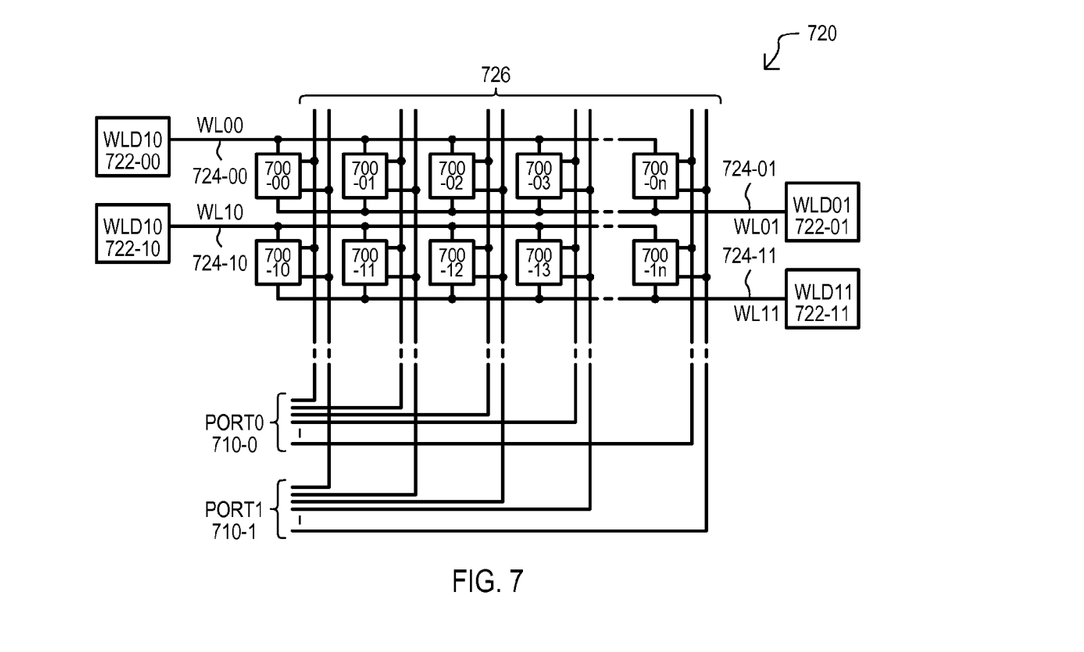
FIG. 7 is a block schematic diagram of a memory device, according to an embodiment.

Referring now to FIG. 7, a memory device 720 according to an embodiment is shown in a block schematic diagram.

A memory device can include a number of memory cells (some shown as 700-00 to -1n) arranged into rows and columns (two rows and (n+1) columns are shown). In the embodiment of FIG. 7, the memory cells (700-00 to -1n) are dual port, and can have a structure that follows any of those shown herein, or equivalents. Memory cells (700-00 to -1n) of a same row can be commonly connected to a same set of word lines, where each word line corresponds to a different port. For example, in FIG. 7, memory cells 700-00 to -0n can be connected to word line WL00 724-00, which can correspond to PORT0 710-0, and word line WL01 724-01, which can correspond to PORT1 710-1.

Memory cells (700-00 to -1n) can also be connected to bit lines 726 in a column direction. More particularly, memory cells (700-00 to -1n) of a same column can be connected to a same set of bit lines, where at least one bit line of each set corresponds to a different port (710-0/1).

In FIG. 7, each word line 724-00 to -11 can be driven by a corresponding word line driver circuit 722-00 to -1. Word line driver circuits (722-00 to -1) each correspond to a particular port 710-0/1. For example, word line driver circuits 722-00/10 can correspond to port 710-0, while word line driver circuits 722-10/11 can correspond to port 710-1. Word line driver circuits of different ports can drive their word lines independently. For example, word line driver circuit 722-00 can drive its word line independently of word line driver circuits 722-01/11, but not independently of word line driver circuit 722-10, which is for the same port.

As noted above, in some embodiments multi-port access can be limited according to access type. That is, while read accesses to a same memory cell can be simultaneous, simultaneous write accesses can be prevented.

Figure 8A:
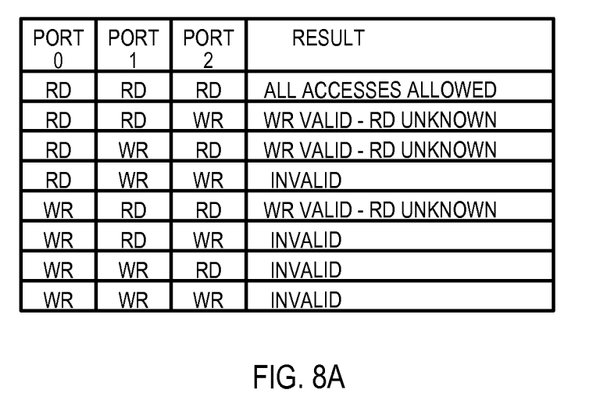
FIGS. 8A and 8B show a memory device and operations having arbitration of requests, according to an embodiment.

FIG. 8A is a table showing write operation arbitration results according to one particular embodiment. While FIG. 8A shows only three ports (PORT0 to -2), arbitration of any number of ports can be understood from its description. In FIG. 8A, it is assumed that the requests (RD/WR) are to the same memory cell(s).

As shown in FIG. 8A, in the event all ports receive read requests to a same memory cell(s), all such read accesses will be allowed, enabling full read multi-port access.

In contrast, if there is one write request, and all other requests are read requests, the write request will be enabled, and all read requests will be invalid (i.e., yield results that cannot be guaranteed to be valid).

If there is more than one write request at the same time, such operations are considered invalid.

It is understood that FIG. 8A shows but one embodiment.

In some embodiments, an arbitration circuit can be included to restrict certain kinds of simultaneous accesses to a memory cell (or group of memory cells). One embodiment having request arbitration is shown in FIG. 8B.

Figure 8B:
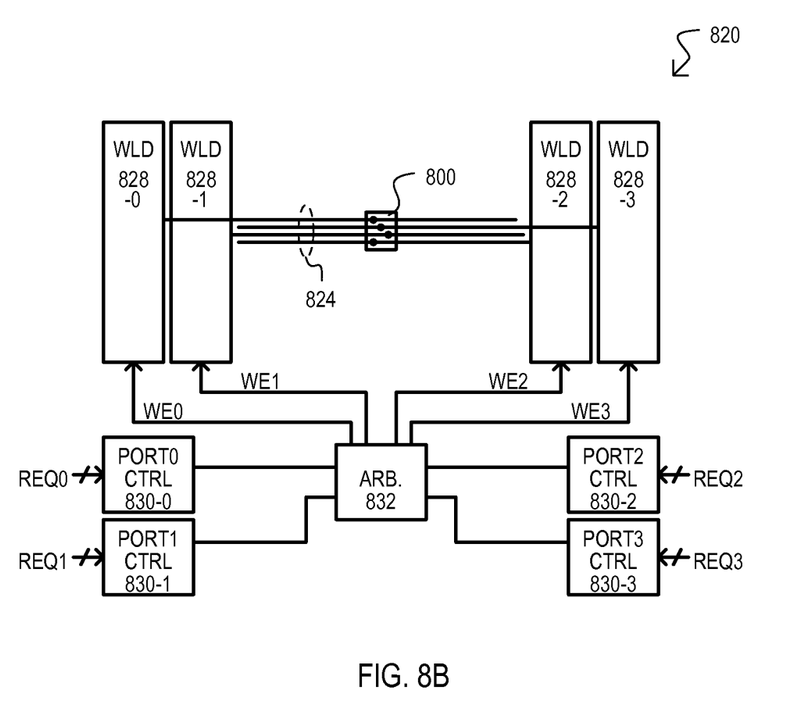

Referring now to FIG. 8B, a memory device 820 according to an embodiment is shown in a block schematic diagram.

A memory device 820 can include a number of memory cells (one shown as 800) arranged into rows and columns. In the embodiment shown, a memory device 820 can include four ports, and so includes four word line driver groups 828-0 to -3 and four port control circuits 830-0 to -3. Word line driver groups (820-0 to -3) can each provide a word line (a set shown as 824) for a row of memory cells. Each word line driver group (820-0 to -3) can drive its word lines independently of the other word line groups. In the embodiment shown, each word line driver group (820-0 to -3) can be enabled or disabled according to a corresponding enable input (WE0 to WE3).

Port control circuits (830-0 to -3) can receive read and write requests for each port. Such requests can take form of one or more control signals being driven to particular values, accompanied by address information identifying which memory cell(s) are to be accessed.

Request information from each port control circuits (830-0 to -3) can be provided to an arbiter circuit 832. An arbiter circuit 832 can generate enable signals (WE0 to WE3) for each word line driver groups (820-0 to -3). Arbiter circuit 832 can thus prevent port accesses for certain simultaneous requests, or request combinations, to a same memory cell(s).

For some types of memory elements, such as CBRAM elements, for example, write operations can take longer than read operations. According to some embodiments, a memory device can store write data values before they have been written into memory elements, and make such data available for read requests to the same location. One such embodiment is shown in FIGS. 9A to 9C.

Figure 9A:
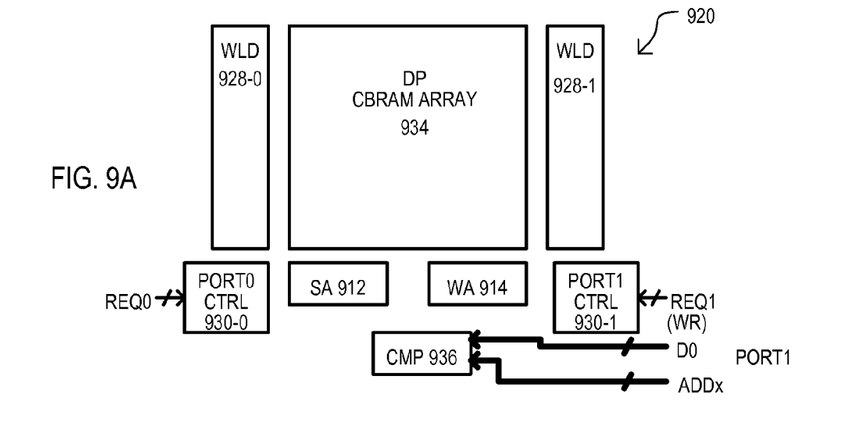
FIGS. 9A to 9C are block schematic diagrams showing a memory device having a delayed write operation, according to an embodiment.
Figure 9B:
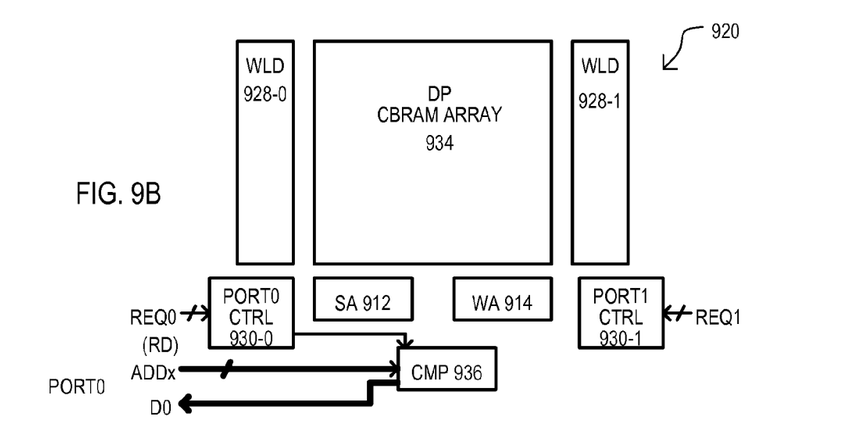
Figure 9C:
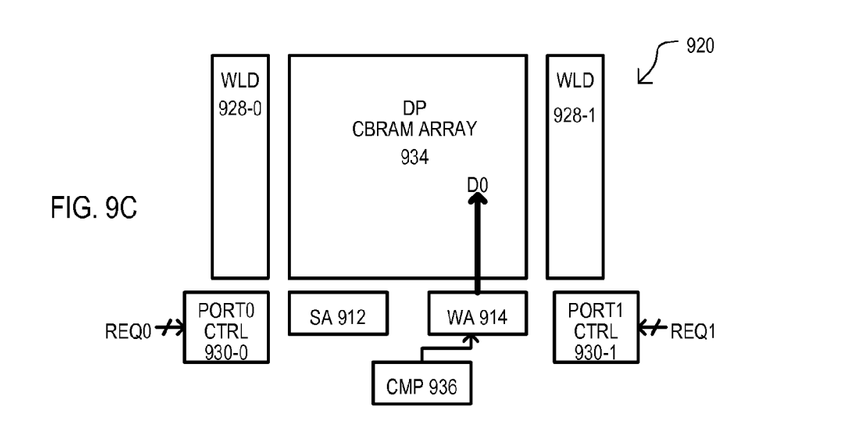

FIGS. 9A and 9C show a memory device 920 having a multi-port memory cell array 934, word line driver groups 928-0/1, port control circuits 930-0/1, sense amplifiers 912, write amplifiers 914, and store/compare circuit 936. Memory cell array 934 can include multi-port memory cells having one or more memory elements according to embodiments herein, or equivalents. In the particular embodiment shown, a memory cell array 934 can be formed from dual port CBRAM type memory cells.

Word line driver groups 928-0/1 and port control circuits 930-0/1 can operate as described in the embodiments herein, and equivalents. Sense amplifiers 912 can sense a state of elements within memory array 934 to generate output read data. Write amplifiers 914 can establish states of elements within memory cell array in response to write data. Store/compare circuit 936 can store a received write data value and the corresponding address, and compare such an address to an incoming read address.

Having described the various sections of memory device 920, an operation of the device will now be described.

FIG. 9A shows at write request at PORT1, with a write data value D0 and write address of ADDx. Rather than write such data immediately, the write data and address can be stored by store/compare circuit 936.

FIG. 9B shows at read request at PORT0, shortly after the previous write request shown in FIG. 9A. The read address can be received by store/compare circuit 936. In the embodiment shown, a read address can be the same as the previous write address (ADDx). Store/compare circuit 936 can compare the received address to the stored address. Because they are the same, the store/compare circuit 936 can output the write data (D0) as read data on port PORT0.

FIG. 9C shows write amplifier 914 writing the write data (D0) stored in store/compare circuit 936 to the appropriate memory elements (at address ADDx). In some embodiments, such a delayed write operation can occur based on time becoming available, or being made available, by the memory device.

While embodiments can include multi-port memory cells and devices, other embodiments can include systems with multi-port memory cells. Particular examples of such embodiments are shown in FIGS. 10 and 11.

Figure 10:
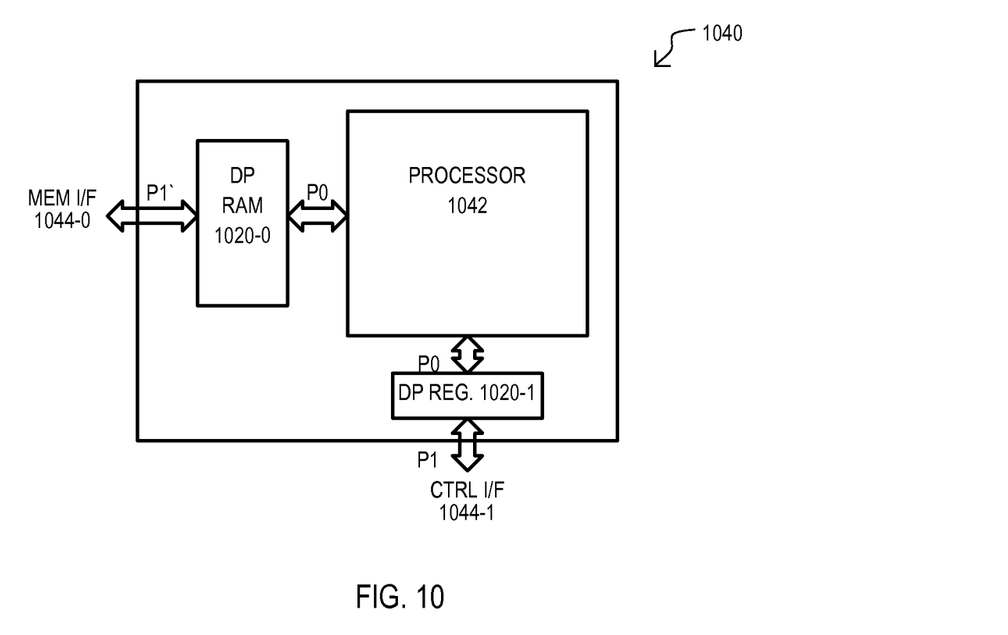
FIG. 10 is a block schematic diagram of a processor system, according to an embodiment.
Figure 11:
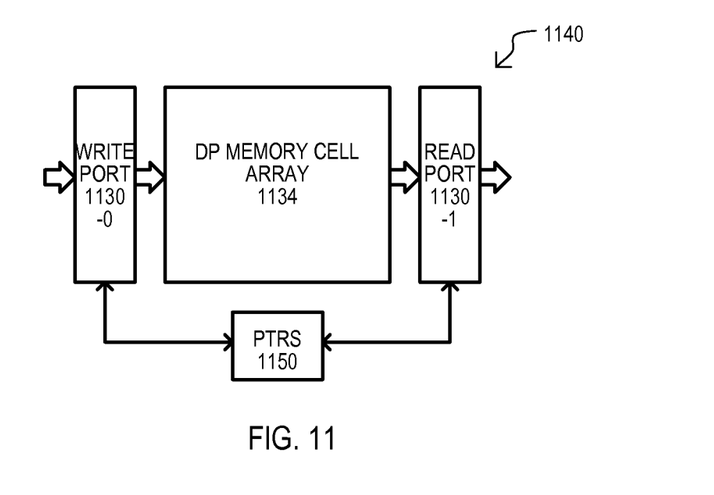
FIG. 11 is a block schematic diagram of a first-in-first-out type memory device, according to an embodiment.

FIG. 10 shows a processor system 1040 according to an embodiment. A system 1040 can include a processor 1042, a dual port RAM 1020-0 and dual port registers 1020-1. In one very particular embodiment, a processor system 1040 can be realized on a single integrated circuit device, as a system-on-chip.

A dual-port RAM 1020-0 can be a memory device, as described herein, or an equivalent, having a compact form and memory elements programmable between two or more impedance states. A dual-port RAM 1020-0 can have one port P0 connected to processor 1042, and another port (P1) accessible by other devices, via a memory interface 1044-0.

Dual port registers 1020-1 can store values for use by the system, such as configuration values and flags. Dual port registers 1020-1 can have one port P0 connected to processor 1042 and another port (P1) accessible by other devices, via control interface 1044-1.

FIG. 11 shows a first-in-first out memory (FIFO) 1140 according to an embodiment. A FIFO 1140 can include a dual-port memory cell array 1134 according to embodiments herein, or equivalents. Memory cell array 1134 can be accessed by a first port 1130-0, that only performs write operations, and a second port 1130-1, that only performs read operations. Pointers 1150 can provide address information to ports 1130-0/1 to enable first-in-first-out accesses. A write port 1130-0 can increment a write address pointer with each write operation it executes. Similarly, a read port 1130-1 pointer can decrement a read address pointer with each read operation it executes.

In some embodiments, a FIFO 1140 can form one part of a larger integrated circuit device.

Embodiments of the invention can provide multi-port memory circuits having a compact structure, with memory cells with as few as one active device per port. Further, unlike conventional SRAM type memories, memory elements can be nonvolatile, such as CBRAM type elements. Such non-volatility can lead to power savings, as a device can be powered off, without loss of data.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
at least two ports for transferring data to and from the memory device; and
plurality of memory cells, each memory cell including at least one element programmable between different impedance states, and a plurality of N access devices, each access device providing a current path between the element and a different one of the ports; wherein N is at least two;
each element is a two terminal element that changes from one impedance state to another when a current greater than a program current flows through it; and
each access device is configured to limit a current through it to less than 1/N of the program current in a read operation.

2. The memory device of claim 1, wherein:
the memory elements comprise a programmable resistance material formed between two electrodes.

3. The memory device of claim 2, wherein:
the memory elements each comprise a solid state electrolyte in which conductive regions are formed and dissolved.

4. The memory device of claim 1, wherein:
each access device comprises an insulated gate field effect transistor.

5. The memory device of claim 1, wherein:
each memory cell includes
two elements programmable to different impedance states, and
the access devices include a pair of access devices corresponding to each port, one access device of each pair coupling one element to its port, the other access device of the pair coupling the other element to its port.

6. The memory device of claim 1, wherein:
the memory cells are arranged into an array of rows and columns, memory cells of a same row having access devices connected to same group of word lines, and memory cells of a same column having access devices connected to same group of bit lines.

7. The memory device of claim 1, wherein:
a control circuit configured to enable multiple access devices of a memory cell at the same time in response to simultaneous read accesses from the ports corresponding to such access devices.

8. The memory device of claim 1, wherein:
the access devices are configured to provide simultaneous current paths between corresponding ports and the element in response to simultaneous read operations at the ports.

9. The memory device of claim 1, wherein:
the access devices are configured to provide one current path between one port and the corresponding element in response to simultaneous accesses at multiple ports, one of which is a write access.

10. A memory device, comprising:
a plurality of memory elements, each programmable between at least two different impedance states; and
a set of N access devices corresponding to each memory element, each configured to enable and disable a current path to a different access port in response to different selection signals; wherein
N is at least two;
each memory element is a two terminal element that changes from one impedance state to another when a current greater than a program current flows through it; and
each access device is configured to limit a current through it to less than 1/N of the program current in a read operation.

11. The memory device of claim 10, wherein:
each set of N access devices is configured to enable only one of the access devices in response to one of multiple accesses being a write access.

12. The memory device of claim 10, wherein:
the access devices are enabled and disabled according to a periodic timing signal for synchronous accesses to the memory elements.

13. The memory device of claim 10, wherein:
the access devices are enabled and disabled according to input signals for asynchronous accesses to the memory elements.

14. The memory device of claim 10, wherein:
each set of N access devices is configured to enable only one of the access devices in response to write accesses from multiple ports to the corresponding memory element.

15. A method, comprising:
in a memory device having a plurality of memory elements programmable between at least two different impedance states,
enabling current paths between a memory element and multiple ports in response to read requests on the multiple ports at the same time,
in a read operation,
applying a read bias voltage to one terminal of a memory element, and
preventing a flow of current through the memory element to less than a disturb current regardless of how many current paths are enabled; wherein
a disturb current can alter an impedance of the memory element by more than a predetermined amount.

16. The method of claim 15, further including:
enabling only one current path to one port, in response to a write request on one port and another access request on another port at the same time.

17. The method of claim 15, further including:
in a read operation,
detecting a current flow through the memory element; wherein
the memory element has an impedance that varies according to conductive regions that formed and dissolved according to an applied electric field.

18. The method of claim 15, further including:
in response to a write request at one port,
enabling a first write current to flow through the memory element in a first direction via only one of the current paths in response to first write data, and
enabling a second write current to flow through the memory element in a second direction via only one of the current paths in response to second write data.

* * * * *